United States Patent
Macneil

(10) Patent No.: US 7,279,201 B2
(45) Date of Patent: Oct. 9, 2007

(54) METHODS AND APPARATUS FOR FORMING PRECURSORS

(75) Inventor: John Macneil, Cardiff (GB)

(73) Assignee: Aviza Europe Limited, Newport, Gwent (GB)

( * ) Notice: Subject to any disclaimer, the term of this patent is extended or adjusted under 35 U.S.C. 154(b) by 0 days.

(21) Appl. No.: 10/471,785

(22) PCT Filed: Apr. 4, 2002

(86) PCT No.: PCT/GB02/01592

§ 371 (c)(1),
(2), (4) Date: Sep. 16, 2003

(87) PCT Pub. No.: WO02/081772

PCT Pub. Date: Oct. 17, 2002

(65) Prior Publication Data

US 2004/0149220 A1    Aug. 5, 2004

(30) Foreign Application Priority Data

Apr. 7, 2001   (GB)   ................ 0108782.4

(51) Int. Cl.
  *C23C 14/00*   (2006.01)
  *B05D 3/00*   (2006.01)
(52) U.S. Cl. ............... 427/562; 427/561; 204/192.12; 204/298.07; 204/298.26; 204/298.25

(58) Field of Classification Search ............. 427/248.1, 427/561, 562; 204/192.1, 298.07, 298.25, 204/298.21, 192.12, 298.26; 118/719, 723 ME, 118/723 ER, 723 IR See application file for complete search history.

(56) References Cited

U.S. PATENT DOCUMENTS

| | | |
|---|---|---|
| 4,006,070 A | 2/1977 | King et al. |
| 4,125,446 A | 11/1978 | Hartsough et al. |
| 4,492,620 A * | 1/1985 | Matsuo et al. ......... 204/192.12 |
| 4,620,913 A * | 11/1986 | Bergman ................ 204/192.1 |
| 4,957,604 A | 9/1990 | Steininger |

(Continued)

FOREIGN PATENT DOCUMENTS

EP   0 322 466 A1 *   7/1989

(Continued)

*Primary Examiner*—Timothy Meeks
*Assistant Examiner*—David Turocy
(74) *Attorney, Agent, or Firm*—Volentine & Whitt, PLLC

(57) ABSTRACT

This invention relates to a method of forming a precursor for chemical vapour deposition including the steps of: (a) forming metal ions at a source, (b) introducing the ions into a reaction chamber; and (c) exposing the ions to a gas or gasses within the chamber to react with the ions to form the precursor.

15 Claims, 1 Drawing Sheet

U.S. PATENT DOCUMENTS

Figure 1:
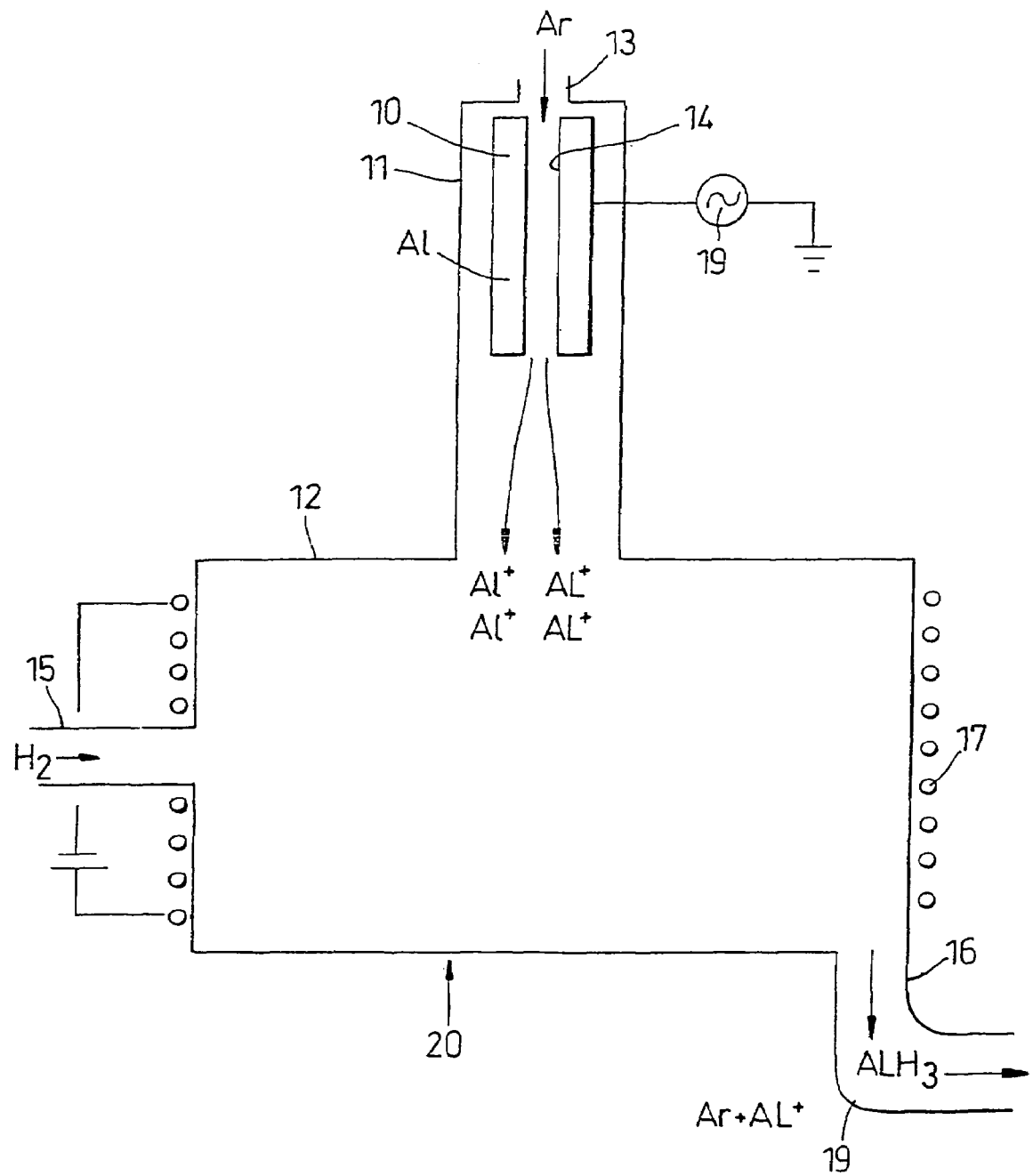

| | | | |
|---|---|---|---|
| 5,059,292 A * | 10/1991 | Collins et al. ............... 204/164 |
| 5,085,885 A | 2/1992 | Foley et al. |
| 5,322,605 A | 6/1994 | Yamanishi |
| 5,429,731 A | 7/1995 | Osano et al. |
| 5,507,931 A | 4/1996 | Yang |
| 5,576,060 A | 11/1996 | Hirai et al. |
| 5,605,610 A | 2/1997 | Ishibashi |
| 5,614,070 A * | 3/1997 | Moon .................... 204/298.07 |
| 5,620,576 A | 4/1997 | Wordenweber |
| 5,665,210 A | 9/1997 | Yamazaki |
| 5,698,312 A | 12/1997 | Kashiwaya |
| 5,698,314 A | 12/1997 | Goedicke et al. |
| 5,716,501 A | 2/1998 | Kawashima et al. |
| 5,750,207 A | 5/1998 | Hammond et al. |
| 5,792,324 A * | 8/1998 | Seon .................... 204/192.15 |
| 5,851,365 A | 12/1998 | Scobey |
| 5,969,423 A | 10/1999 | Raina et al. |
| 6,346,301 B2 * | 2/2002 | Beele et al. ................. 427/561 |
| 6,440,494 B1 * | 8/2002 | Arena-Foster ............... 427/250 |
| 6,451,184 B1 * | 9/2002 | Sone ..................... 204/298.11 |
| 6,551,471 B1 * | 4/2003 | Yamaguchi et al. ... 204/192.12 |
| 6,752,912 B1 * | 6/2004 | Sandhu .................. 204/192.15 |
| 2001/0030125 A1 * | 10/2001 | D'Couto et al. ....... 204/192.17 |
| 2001/0052455 A1 * | 12/2001 | Hong .................... 204/192.12 |
| 2003/0141486 A1 * | 7/2003 | Wang et al. ............ 204/298.07 |

FOREIGN PATENT DOCUMENTS

| | | |
|---|---|---|
| EP | 0 482 265 A1 * | 4/1992 |
| EP | 0 573 348 A1 * | 12/1993 |
| GB | 2 296 505 A | 7/1996 |
| GB | 2 349 392 A | 11/2000 |
| JP | 61288069 | 12/1986 |
| WO | WO 89/01988 | 3/1989 |
| WO | WO 97/32057 | 9/1997 |
| WO | WO 99/04054 | 1/1999 |

* cited by examiner

METHODS AND APPARATUS FOR FORMING PRECURSORS

This invention relates to a method and apparatus for forming a precursor for chemical vapour deposition.

Chemical vapour deposition (CVD) of all types is an attractive methodology for depositing thin films onto nano-structures e.g. semiconductor wafers, magnetic heads, MEMS etc. However its application can, to a great extent, be limited by the availability of suitable precursors. These are synthesised by specialist manufacturers and are delivered in solid, liquid or gaseous form to equipment users, who operate processes whereby these precursors are broken down from their (relatively) stable state and react in reaction chambers to form the desired film. These reactions are well known in the prior art.

However, many desirable CVD processes are comprised or ruled out by the limited-availability of suitable stable precursors. The Applicant has realised that by forming a synthesis reaction chamber located close by or even within a deposition chamber, these problems of stability might be overcome.

U.S. Pat. No. 5,085,885 describes a localised formation of metal hydrides or organometallics. This aims to create a precursor by forming a stream of gas containing free radicals by the application of a microwave plasma and reacting that gas in the absence of any applied energy with a thin metallic target to form a precursor. This approach is limiting in many ways. First it has a low efficiency, secondly the target is likely to become coated or poisoned by the precursor that has been formed and thirdly as the reaction is carried out as a surface reaction of a gas radical on the metal, the precursors that can be formed are rather limited in both volume and type.

From one aspect the present invention consists in a method of forming a precursor particularly a vapour or gas for chemical vapour deposition including the steps of:

(a) forming metal ions at a source;

(b) introducing the ions into a reaction chamber; and (c) exposing the ions to a gas within the chamber to react with the ions to form the precursor It is particularly preferred that the pressure in the chamber is less than the pressure at the source and thereby the gas, with which the ions react, is prevented from coming to contact with the source. This can particularly be achieved by streaming an inert sputter gas to, through or past a target e.g. by the use of a hollow cathode so that it carries the target ions into the reaction chamber. Preferably the sputter gas path is straight and the flow of gas will also reduce the amount of metal which is sputtered onto surfaces of the chamber and other parts of the apparatus.

The reaction chamber might be or form part of the CVD chamber, or alternatively the precursor may be fed to a reservoir or directly to a CVD chamber.

The invention is useful in connection with the CVD of copper, $Ti_2$, $Al_2O_3$, PZT and other metals, metal oxides and compounds. These are used for interconnect materials, barrier layers, seed layers for other metal depositions (e.g. to alter their physical structure), high-k dielectric layers (e.g. for capacitors) or for use in magnetic heads as part of read or write heads or as parts of electrical or optical filters.

From another aspect the invention consists in apparatus for forming a precursor for chemical vapour deposition including a reaction chamber, a metal target, an input for streaming an inert sputter gas past, to or through the target to sputter ions from the target and form a stream of ions in the reaction chamber, an input for feeding a gas or gasses into the reaction chamber to form the precursor by reacting with the metal ions and an outlet for the precursor.

It is preferred that the pressure at the target is greater than the pressure in the reaction chamber.

The apparatus may further include a reservoir for locally storing the precursor, or alternatively the apparatus may form a part of or be directly connected to a CVD chamber.

The apparatus may include at least one confinement device for confining the ions to a region of the reaction chamber to enhance precursor formation. For example, a magnetic field may be provided around the reaction chamber e.g. by an electromagnetic coil or permanent magnets creating a magnetic bucket.

The target may either be located at the reaction chamber or be remote. In the latter case the stream of target ions may be caused by the sputter gas flowing to the reaction chamber.

Whatever the arrangement, where the precursor is being in created in or fed direct to the CVD chamber substantially no unreacted sputtered target material should reach the substrate. Equally the reaction chamber should be sufficiently large to allow sufficient time in flight for the metal ion/gas reactions to take place.

Although the invention has been defined above, it includes any inventive combination of the features set out above or in the following description.

The invention may be performed in various ways and a specific embodiment will now be described, by way of example, with reference to the accompanying drawing which is a schematic view of apparatus for forming precursors.

The invention will be specifically described in connection with the formation of $AlH_3$, which is an unstable material that decomposes at atmospheric pressure at a temperature of approximately 150° C. it will be understood that this is merely an example and the principles involved can be applied to many other precursors.

Turning to FIG. 1, an aluminium hollow cathode 10 is disposed within an inlet tube 11 that debouches into a reaction chamber 12. An inlet 13, for an inert sputtering gas (e.g. argon or krypton), is provided in line with the central passage 14 of the cathode 10. The reaction chamber 12 has a gas inlet 15 and a precursor outlet 16. The chamber 12 is surrounded by an electromagnetic coil 17, which is driven from a DC supply 18 whilst a further DC or RF supply 19 drives the cathode 14.

To fabricate $AlH_3$, Argon is streamed through the passage 14 to sputter $Al^+$ ions from the surface of the aluminium cathode 10 and the stream of gas carries these ions into the reaction chamber 12. The coil 17 is used to confine these ions into a central region where they are exposed to $H_2$. The resultant reaction forms $AlH_3$ that can be extracted through the outlet 16 via filter trap, bend 19.

Most conveniently the apparatus indicated in the drawing will be positioned immediately adjacent the CVD chamber and the precursor can then be passed to the CVD chamber, for example through a showerhead. Steps can be taken to maintain the hydride at a suitable temperature to minimise condensation.

The arrangement is specifically described in connection with a hollow cathode being sputtered by a noble gas, but the target may be of the self-ionising type not requiring a flow of sputter gas or other metal ion sources could be use, such as heated filaments. The sputter target option is the most preferred and in general it is envisaged that a carrier gas will be needed to Lake the ions to the reaction zone so that the target is kept apart from the gas used to form the precursor and indeed from the precursor itself.

It will be understood that the ions may be of any suitable metal; the metal being selected by the chemical nature of the precursor required. Whilst a gaseous precursor is described by example the invention also covers the production of a liquid or solid the essential characteristic being that they may be unstable or readily contaminated under normal storage conditions.

In the case of a solid precursor this may form as a solid at point 20 and then be sublimated by heating for use as a CVD precursor whereby a carrier gas may be flowed e.g. via inlet 15 or 13 or another inlet through the reaction chamber whilst precursor formation is halted. A liquid precursor could be formed and used in a CVD process by similar means.

The invention claimed is:

1. A method of forming a chemical vapour deposition (CVD) precursor within a reaction chamber, including the steps of:
   (a) forming atomic-metal ions at a source located outside the reaction chamber;
   (b) introducing the ions into the reaction chamber; and
   (c) exposing the ions to a gas or gasses within the chamber to react with the ions to form the CVD precursors,
   wherein the pressure in the chamber is less than the pressure at the source to prevent the gas or gasses from contacting the source during formation of the atomic-metal ions.

2. A method as claimed in claim 1 wherein the ions are introduced by means of a carrier gas.

3. A method as claimed in claim 1 wherein the reaction chamber is or forms part of a CVD chamber.

4. A method as claimed in claim 1 wherein the CVD precursor is stored or fed directly to a CVD chamber.

5. A method as claimed in claim 4 wherein the CVD precursor is a metallic organic compound.

6. A method as claimed in claim 1, wherein the ions are introduced into the reaction chamber through an inlet tube that debouches into the reaction chamber.

7. A method as claimed in claim 1, wherein the atomic-metal ions are atomic aluminum $Al^+$ ions.

8. A method as claimed in claim 1, wherein the atomic-metal ions are atomic copper $Cu^+$ ions.

9. A method as claimed in claim 1, wherein the atomic-metal ions are atomic titanium $Ti^+$ ions.

10. A method as claimed in claim 1, further comprising using the CVD precursor as a reactant in a subsequent CVD deposition process.

11. A method of forming a precursor for chemical vapour deposition (CVD) precursor within a reaction chamber, comprising:
    forming atomic-metal ions at a source located outside the reaction chamber;
    introducing the ions into the reaction chamber;
    exposing the ions to a gas or gasses within the chamber to react with the ions to form the CVD precursor; and
    preventing the gas or gases from contacting the source during formation of the atomic-metal ions.

12. The method of claim 11, wherein the ions are introduced in the reaction chamber by a carrier gas, and wherein the pressure in the reaction chamber is less than the pressure at the source.

13. The method as claimed in claim 12, wherein the atomic-metal ions are one of atomic aluminum $Al^+$ ions, atomic copper $Cu^+$ ions, and atomic titanium $Ti^+$ ions.

14. The method as claimed in claim 13, wherein the CVD precursor is a metallic organic compound.

15. The method as claimed in claim 14, further comprising using the CVD precursor as a reactant in a subsequent CVD process.

* * * * *